United States Patent
Takemura et al.

(10) Patent No.: US 6,184,577 B1
(45) Date of Patent: Feb. 6, 2001

(54) ELECTRONIC COMPONENT PARTS DEVICE

(75) Inventors: Kenzo Takemura, Yuki; Itsuo Watanabe, Shimodate; Akira Nagai, Tsukuba; Osamu Watanabe, Tsukuba; Kazuyoshi Kojima, Tsukuba; Akishi Nakaso, Oyama; Kazunori Yamamoto, Tsukuba; Yoshiyuki Tsuru; Teiichi Inada, both of Shimodate; Yasushi Shimada, Tsukuba, all of (JP)

(73) Assignee: Hitachi Chemical Company, Ltd. (JP)

( * ) Notice: Under 35 U.S.C. 154(b), the term of this patent shall be extended for 0 days.

(21) Appl. No.: 09/308,525

(22) PCT Filed: Nov. 4, 1997

(86) PCT No.: PCT/JP97/04003

§ 371 Date: Aug. 30, 1999

§ 102(e) Date: Aug. 30, 1999

(87) PCT Pub. No.: WO98/20542

PCT Pub. Date: May 14, 1998

(30) Foreign Application Priority Data

Nov. 1, 1996 (JP) .................................................. 8-292050
Nov. 29, 1996 (JP) .................................................. 8-320116
Oct. 30, 1997 (JP) .................................................. 9-298938

(51) Int. Cl.[7] .............................. H01L 23/63; H01L 23/12
(52) U.S. Cl. .......................... 257/701; 257/702; 257/737; 257/778; 257/783; 257/795; 257/782; 361/748; 361/750; 361/757; 361/762

(58) Field of Search ........................... 257/701, 702, 257/778, 783, 795, 787–789, 782, 737; 361/748, 750, 757–762

(56) References Cited

U.S. PATENT DOCUMENTS

| 5,350,621 | * | 9/1994 | Yuhas et al. | 428/209 |
| 5,844,320 | * | 12/1998 | Ono et al. | 257/778 |
| 6,002,180 | * | 12/1999 | Akram et al. | 257/783 |
| 6,090,468 | * | 7/2000 | Shimada et al. | 428/137 |
| 6,121,289 | * | 9/2000 | Capote et al. | 257/783 |

FOREIGN PATENT DOCUMENTS 7-231050   8/1995   (JP) .
8-124965   5/1996   (JP) .

* cited by examiner

*Primary Examiner*—Tom Thomas
*Assistant Examiner*—Nitin Parekh
(74) *Attorney, Agent, or Firm*—Pennie & Edmonds LLP

(57) ABSTRACT

In regard to a packaging substrate on which a semiconductor chip is mounted, the surface copper foil of a double-sided copper-clad glass epoxy resin laminated sheet is subjected to circuit formation and inner-layer bonding, then an epoxy resin adhesive film with copper foil is bonded to the surface of the inner-layer circuit by press lamination, and a through hole is formed through the sheet, followed by electroless copper plating, outer-layer circuit formation by the subtractive process, and solder coating to obtain the packaging substrate. The bump electrode of the semiconductor chip and the packaging substrate are connected through an adhesive film.

8 Claims, 1 Drawing Sheet

ELECTRONIC COMPONENT PARTS DEVICE

TECHNICAL FIELD

This invention relates to an electronic component part device such as a semiconductor device. More particularly, it relates to an electronic component part device such as a semiconductor device in which connecting electrodes of a semiconductor chip and corresponding connecting electrodes on a semiconductor packaging substrate are brought into contact with one another and are fastened by bonding them with an adhesive such as an anisotropic conductive adhesive and at the same time the electrodes of the both are electrically interconnected.

BACKGROUND ART

As methods for packaging semiconductor chips directly on a packaging substrate by face-down bonding, commonly used are flip-chip bonding in which bumps are formed at electrode areas of a semiconductor chip followed by soldering to a packaging substrate, and a connecting method in which bump electrodes provided on a semiconductor chip are coated with a conductive adhesive and are bonded to electrodes of a packaging substrate.

An anisotropic conductive adhesive having conductive particles dispersed therein is also available as a means by which electronic component parts such as semiconductor chips are electrically interconnected to a packaging substrate by mechanical electrode connection. More specifically, an adhesive film is provided between electronic component parts and electrodes or circuits and then a pressing or heat-pressing step is taken whereby the electrodes of the both are electrically interconnected to one another and at the same time an insulation performance between adjacent electrodes is imparted, thus the electronic component part devices are bonded and fastened to the circuits. This method of packaging by mechanical electrode connection is presently applied to glass substrates, and also studies are being made on its application to wiring boards made of glass-cloth reinforced resins having high general-purpose properties.

In addition, as a method of connecting electronic component parts such as semiconductor chips electrically to a packaging substrate by mechanical electrode connection, a method is also proposed in which gold bumps are formed on electrodes of a semiconductor chip, then mechanically brought into contact with gold electrodes provided on the side of a packaging substrate and at the same time held and fastened by a thermosetting or photosetting adhesive.

The wiring boards made of glass-cloth reinforced resins, used as packaging substrates, can enjoy a higher wiring density and also are economically feasible for multi-layer wiring, thus they are most commonly put into used as wiring materials. However, conventional wiring boards made of glass-cloth reinforced resin of FR-4-grade have a larger coefficient of linear expansion in the X- and Y-directions than chips and also the wiring boards made of glass-cloth reinforced resins have a high modulus of elasticity. Hence, the heat stress at the time of heat cycling, produced in packaging structure of packaging substrates, is so large as to cause a lowering of connection reliability of the packaging structure. There has been such a problem.

There has been another problem that, since a glass cloth is used as a reinforcing material, the surface of electrodes formed on the surface of the wiring board undulates periodically and hence the electrodes have uneven height to have a low connection reliability.

DISCLOSURE OF THE INVENTION

The present invention was made taking account of the above problems when electronic component parts such as semiconductor chips are electrically interconnected to a packaging substrate by mechanical electrode connection through an adhesive such as an anisotropic conductive adhesive having conductive particles dispersed therein, and provides an electronic component part device such as a semiconductor device in which semiconductor chips can be connected to a packaging substrate of multi-layer wiring board and which has a superior long-term connection reliability.

The present invention is an electronic component part device having a packaging substrate and at least one electronic component part mounted on the packaging substrate;

the electronic component part has a connecting electrode on the side coming into contact with the packaging substrate;

the packaging substrate has, on its surface, a connecting electrode terminal corresponding to the connecting electrodes of the electronic component part to be mounted; and the electronic component part being so provided that it is mounted on the connecting electrode terminal at the mounting position on the surface of the packaging substrate, with its own connecting electrode correspondingly to the connecting electrode terminal, the face of the electronic component part on which the connecting electrode have been formed and the surface of the packaging substrate are fastened by bonding through an adhesive, and the connecting electrode terminal of the substrate and the connecting electrode of the electronic component part are electrically interconnected; wherein;

the packaging substrate comprises;

a plurality of insulating layers;

a plurality of wiring layers provided between the insulating layers; and a conductor provided in such a way that it passes through at least one constituent layer of the insulating layers, in order to electrically interconnect predetermined layers among the wiring layers;

the plurality of insulating layers having;

at least one first insulating layer containing a resin reinforced with a glass base material; and as an outermost layer, a second insulating layer which constitutes one layer at least on the side where the electronic component part is fastened by bonding;

the first insulating layer having a storage elastic modulus represented by E1, as measured by the DVE method, and the second insulating layer having a storage elastic modulus represented by E2, as measured by the DVE method, which are;

E2=0.01E1 to 0.5E1.

The above storage elastic modulus can be measured with, e.g., RHEOSPECTRA DVE-4, manufactured by Rheology Co., Ltd. (tension mode; frequency: 10 Hz; temperature rise: 5° C./min; measured at from −40° C. up to 250° C.). The storage elastic moduli E1 and E2 are compared as values at the same temperature not higher than glass transition temperature Tg.

The present invention makes it possible to obtain an electronic component part such as a semiconductor device, promising a superior connection reliability between electronic component parts such as semiconductor chips, and a packaging substrate.

BEST MODES FOR PRACTICING THE INVENTION

Figure 1:
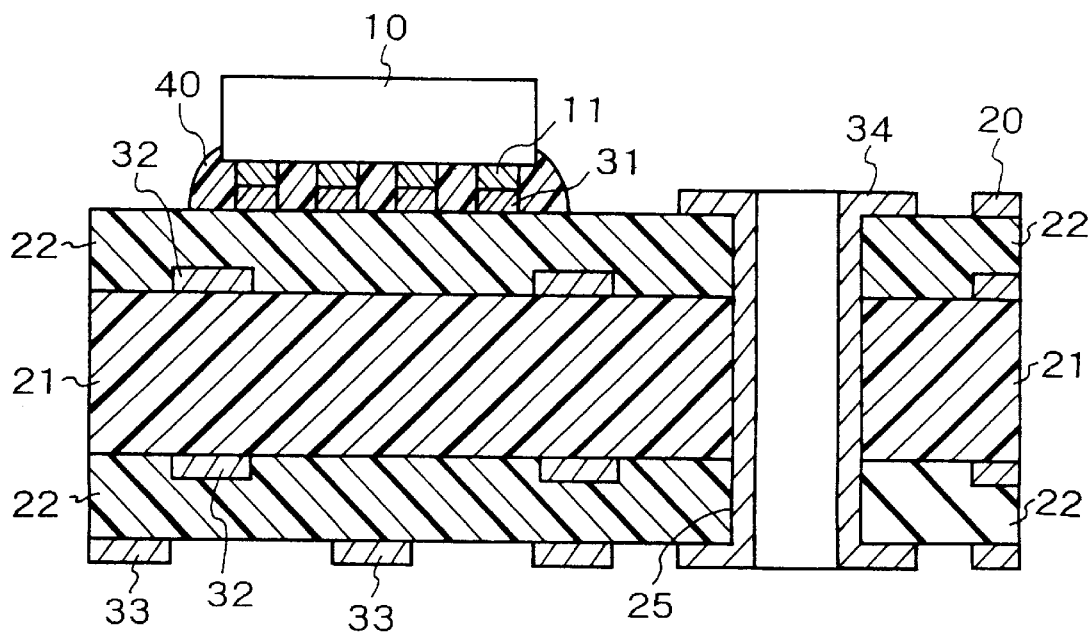
FIG. 1 is a cross-sectional view showing an example of the construction of the electronic component part device of the present invention.
Figure 2:
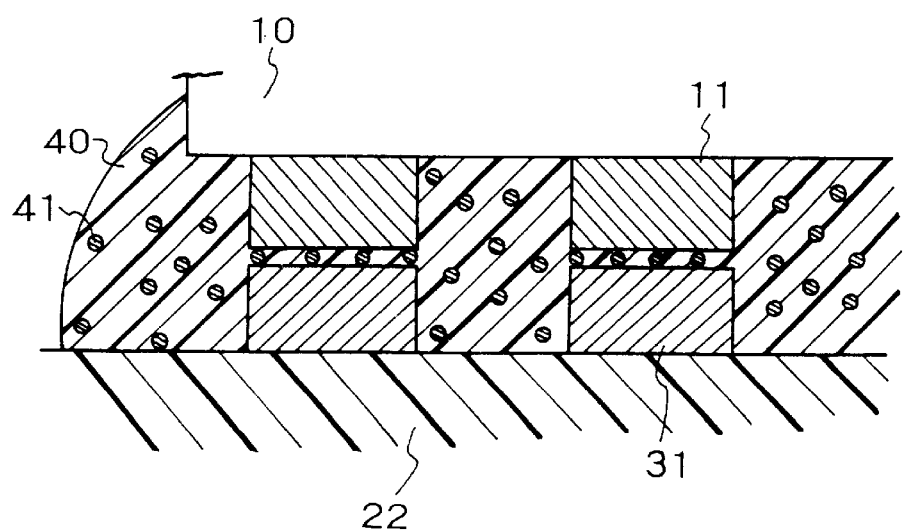
FIG. 2 is a cross-sectional view showing an example of how an electronic component part and a packaging substrate stand connected.

An example in which a semiconductor chip is connected to a packaging substrate will be described with reference to FIGS. 1 and 2. FIG. 1 shows an example in which a semiconductor chip and a packaging substrate are connected through an adhesive containing no conductive particles. FIG. 2 shows the part where, in the instance of FIG. 1, the semiconductor chip and the packaging substrate are connected through an adhesive containing conductive particles.

The electronic component part device shown in FIG. 1 is constituted of a packaging substrate 20 and a semiconductor chip 10 packaged thereon. Incidentally, FIG. 1 shows part of the electronic component part device. In practice, other electronic component parts such as other semiconductor chips are mounted on the packaging substrate 20.

The semiconductor chip 10 is, on one face thereof, provided with bump electrodes (bumps) serving as connecting electrodes 11, and is electrically interconnected with the packaging substrate via the connecting electrodes 11.

The packaging substrate 20 has a plurality of insulating layers 21 and 22, a plurality of wiring layers 32 and 33 provided via the insulating layers 21 and 22, connecting electrode terminals 31 for making connection with the connecting electrodes 11 of the semiconductor chip 10, and a conductor 34 provided in such a way that it passes through the insulating layers 21 and 22, in order to electrically interconnect specified wiring layers among the wiring layers 32 and 33. In order to make the conductor 34 pass through, the insulating layers 21 and 22 are provided, at a necessary spot, with a hole 25 for forming a through hole. That is to say, this packaging substrate constitutes a resin composite type multi-layer wiring board. Here, the wiring layers 32 are provided as an inner-layer circuit, and the wiring layers 33 and connecting electrode terminals 31 are provided as an outer-layer circuit. The connecting electrode terminals 31 function as a conductor circuit to mount the chip thereon.

The bump electrodes (bumps) which are the connecting electrodes 11, provided on the semiconductor chip 10, are registered to the connecting electrode terminals 31 provided on the surface of the packaging substrate 20. A film type adhesive 40 for bonding is disposed between the semiconductor chip 10 and the packaging substrate 20. In this state, pressure and heat are applied on the side of the semiconductor chip 10, whereby the adhesive 40 becomes fluid and then hardens, so that the connecting electrodes 11 provided on the semiconductor chip 10 and the connecting electrode terminals 31 provided on the surface of the packaging substrate 20 come into mechanical direct contact with each other to accomplish electrical interconnection.

In the case when an adhesive 40 such as anisotropic conductive adhesive having conductive particles 41 dispersed therein is used, as shown in FIG. 2, each connecting electrode 11 and each connecting electrode terminal 31 are connected in the state the conductive particles 41 are held between them, and are at the same time fastened by bonding. In the case when the anisotropic conductive adhesive 40 is used and in such a state that opposing electrodes to be connected are brought into pressure contact, conduction takes place between opposing electrodes via the conductive particles present between them. Between adjacent electrodes, the adhesive, though containing the conductive particles, has the conductive particles in so low a density as to show no conductivity.

The packaging substrate 20 has at least one first insulating layer 21 formed of a resin reinforced with a glass base material, and as an outermost layer a second insulating layer which constitutes one layer at least on the side where the electronic component part is fastened by bonding. In the example shown in FIG. 1, a second insulating layer 22 is provided also on the side different from the side where the electronic component part is fastened by bonding. In the example shown in FIG. 1, only one layer is shown as the insulating layer 21, but the present invention is not limited to this example. The insulating layer 21 may be formed in plurality. With regard to the second insulating layer 22, too, it may further be provided in addition to the above.

The packaging substrate 20 is a multi-layer wiring board in which the insulating layers are so provided that the first insulating layer 21 has a storage elastic modulus (hereinafter "elastic modulus") represented by E1, as measured by the DVE method, and the second insulating layer 22 has an elastic modulus represented by E2, as measured by the DVE method, which are;

$E2=0.01E1$ to $0.5E1$.

Here, the E2 may preferably be;

$E2=0.05E1$ to $0.2E1$.

The second insulating layer (after an insulating layer not making use of a glass substrate such as glass cloth has been hardened or, in the case of a thermoplastic resin, after it has been laminated) constituting the outermost layer of the multi-layer wiring board may have elastic moduli of;

from $10^2$ to $10^4$ MPa at 25° C. and from $10^1$ to $10^3$ MPa at 100° C. as measured by the DVE method. This is preferable in view of connection reliability.

The packaging substrate 20 may be constituted of a built-up multi-layer substrate comprising a wiring substrate having i) a base material constituted of an insulating layer making use of glass cloth or ii) a conductor circuit formed in at least one layer, and alternately formed thereon insulating layers and conductor circuit layers. The packaging substrate 20 constituted of such a built-up multi-layer substrate is preferable for accomplishing the constitution of the present invention.

In the multi-layer wiring board, at least one of the first insulating layers may be an insulating layer having a coefficient of linear expansion of 13 ppm/° C. or below in its plane direction. This is preferable for making the whole multi-layer wiring board have a low coefficient of linear expansion, bringing about an improvement in connection reliability.

The packaging substrate 20 in the present invention may make use of a resin film containing no glass cloth, as an insulating layer 22 serving as the outermost layer of the insulating layers.

This resin film may be formed using epoxy resin, polyimide resin, polyamideimide resin, modified polyphenylene ether resin, phenoxy resin, amide epoxy resin, phenol resin, or a mixture or copolymer of any of these. These may also be used in the form of a mixture thereof with a polymeric compound capable of imparting a flexibility, such as acrylic rubber, acrylonitrile rubber, phenoxy resin or PVB. Also usable are films of heat-resistant thermoplastic engineering plastics such as polysulfone, polyether sulfone, polyether ether ketone, totally-aromatic liquid-crystal polyester and fluorine resin.

Those comprising the above resin film and incorporated therein an organic or inorganic filler may also be used.

This resin film may preferably have a thickness of from 20 to 100 μm.

The first insulating layer of the packaging substrate 20 of the present invention, which is constituted of the resin reinforced with a glass base material, may further contain an inorganic filler.

As the adhesive used in the present invention, either of a film type adhesive and a liquid type adhesive may be used. The film type adhesive may only be put on the substrate to carry out the bonding step, without forming any coating on the substrate by coating or printing as in the case of the liquid type. Thus, the film type is preferred, as having features that not only it can be handled with ease, but also enables easy control of layer thickness taking account of the height of connecting terminals. The adhesive may preferably be a thermoplastic high polymer or a cross-linkable high polymer capable of being hardened by energy such as heat, electron rays or light. In particular, epoxy resins, cyanate ester resins or imide resins are preferred. In these resins, a thermoplastic high polymer may be mixed for the purpose of imparting film-forming properties. The bonding is carried out by applying pressure and heat, and hence any excessively high melt viscosity of the adhesive at the time of heating makes the adhesive not removable to make it impossible to ensure electrical conduction. Accordingly, the adhesive may preferably have a melt viscosity of 1,000 poises or below at heating temperature for the bonding.

For the purpose of relaxing the stress caused by a difference in coefficient of thermal expansion between the chips and the substrate, the adhesive in the present invention may preferably have an elastic modulus at 40° C. after bonding, of from 100 to 4,000 MPa, and particularly preferably from 100 to 2,000 MPa. For example, such an adhesive may include an adhesive prepared by compounding an acrylic rubber in a mixture of epoxy resin and a latent curing agent such as imidazoles, hydrazides, trifluoroboron amine complexes, sulfonium salts, amine imides, polyamine salts or dicyandiamides so as to have an elastic modulus of from 100 to 1,500 MPa at 40° C. after bonding. The elastic modulus of the adhesive hardened into a film corresponding to the adhesive at its stage after bonding can be measured with, e.g., RHEOSPECTRA DVE-4, manufactured by Rheology Co., Ltd. (tension mode; frequency: 10 Hz; temperature rise: 5° C./min; measured at from −40° C. up to 250° C.). The adhesive may be hardened into a film under the same conditions as the heating temperature and time used in the step of bonding, and may be hardened (into film) by immersing the adhesive in an oil bath.

The acrylic rubber used in the present invention may include polymers or copolymers formed using as a monomer component(s) at least one of acrylic acid, acrylate, methacrylate and acrylonitrile. In particular, copolymer type acrylic rubbers containing glycidyl acrylates or glycidyl methacrylate containing an glycidyl ether group may preferably be used. These acrylic rubbers may preferably have a molecular weight of 200,000 or more in view of an improvement in cohesive force of the adhesive. If the acrylic rubber compounded in the adhesive is in an amount less than 15% by weight, the adhesive may have an elastic modulus higher than 2,000 MPa at 40° C. after bonding. If it is in an amount more than 40% by weight, the adhesive can be made to have a low elastic modulus but may have so high a melt viscosity at the time of bonding that the molten adhesive can not be made well removable from the interface between connecting electrodes or between connecting electrodes and conductive particles to make it hard to ensure electrical conduction between connecting electrodes or between connecting electrodes and conductive particles. Accordingly, the acrylic rubber may preferably be compounded in an amount of from 15 to 40% by weight. The acrylic rubber compounded in the adhesive has a peak temperature of dissipation factor (loss tangent) ascribable to its rubber component, at around 40 to 60° C. Hence, the adhesive can be made to have a low elastic modulus.

In the adhesive used in the present invention, conductive particles may also be dispersed for the purpose of intentionally imparting anisotropic conductivity in order that any unevenness in height of the bumps or circuit electrodes of a chip can be leveled. In the present invention, usable as the conductive particles are, e.g., metallic particles of a metal such as Au, Ni, Ag, Cu, W or solder, or metallic particles comprising any of these particles on the surfaces of which thin films of gold, palladium or the like have been formed by plating or vapor deposition. Also usable are conductive particles comprising a spherical core material of a high polymer such as polystyrene on which a conductive layer of Ni, Cu, Au, solder or the like has been provided.

Their particle diameter must be smaller than the minimum distance between the electrodes on the substrate, and, when the electrodes have a height unevenness, may preferably be larger than the height unevenness. It may preferably be from 1 μm to 10 μm. The conductive particles may be dispersed in the adhesive in an amount of from 0.1 to 30% by volume, and more preferably from 0.2 to 15% by volume.

As the connecting electrodes 11 of the semiconductor chip in the present invention, usable are plated bumps formed by plating with gold, nickel, solder or the like into bump electrodes; ball bumps which are bump electrodes made up by forming tips of metallic wires of gold, aluminum or the like into balls by the aid of heat energy, compression-bonding the balls onto electrode pads of the semiconductor chip to which the connecting electrodes are to be provided and thereafter cutting off the metallic wires; bumps formed by molding solder balls or molten-solder; and bump electrodes formed by soldering columns.

As in conventional semiconductor packaging substrates constituted of only the glass-cloth reinforced resin, substrates showing elastic moduli of;

(1.5 to 2.0)×10$^4$ MPa at Tg or below, and (4 to 10)×10$^3$ MPa at Tg or above may cause an increase in connection resistance or a separation of adhesive at the bonded areas because of internal stress produced during reliability tests such as a thermal shock test, a PCT test and a solder bath immersion test. However, in the packaging substrate of the present invention, the first insulating layer 21 has an elastic modulus represented by E1, as measured by the DVE method, and the second insulating layer 22 has an elastic modulus represented by E2, as measured by the DVE method, which are;

E2=0.01E1 to 0.5E1. Hence, the packaging substrate can absorb the internal stress produced during the reliability tests and, even after the reliability tests, does not show any increase in connection resistance or any separation of adhesive, bringing about a great improvement in connection reliability.

Commonly available glass epoxy substrates (FR-4 grade) have a coefficient of linear expansion of 16 ppm/° C. in the X- and Y-directions. On the other hand, the use of at least one insulating layer made of glass-cloth reinforced resin having a coefficient of linear expansion of 13 ppm/° C. or below can make the whole packaging substrate have a low coefficient of linear expansion, and hence the internal stress produced at its areas connected to the semiconductor chip can be made smaller.

The adhesive in the present invention has in itself the action to relax internal stress at the connected areas, and, because of the stress relaxation action attributable to the packaging substrate of the present invention, those having an elastic modulus of from 100 to 4,000 MPa at 40° C. can be used. Those having an elastic modulus of from 100 to 2,000 MPa further brings about a great improvement in connection reliability because the internal stress produced during reliability tests such as a thermal shock test, a PCT test and a solder bath immersion test can be absorbed by the adhesive.

As the electronic component part of the present invention, usable are active devices such as semiconductor chips, transistors, diodes and thyristors, and passive devices such as capacitors, resistors and coils.

EXAMPLE 1

Surface copper foil of a double-sided copper-clad glass-cloth epoxy resin laminated sheet MCL-E-679 (trade name; available from Hitachi Chemical Co., Ltd.), having a coefficient of linear expansion of 16 ppm/° C. in the X- and Y-directions, a Tg of about 170° C. and an elastic modulus of $1.8 \times 10^4$ MPa at Tg or below, was subjected to inner-layer circuit formation by a conventional subtractive process and inner-layer bonding. Next, a glass-cloth-free epoxy resin adhesive film with copper foil, MCF-3000E (trade name; available from Hitachi Chemical Co., Ltd.; Tg: about 130° C.; elastic modulus at Tg or below: $0.23-0.3 \times 10^4$ MPa) previously drilled was bonded on the inner-layer circuit surface by press lamination at 170° C. under 40 kgf/cm$^2$ for 60 minutes, and then through holes were made, followed by electroless copper plating, outer-layer circuit formation by the subtractive process, and solder coating to obtain a packaging substrate. As semiconductor chips, used were those in which bump electrodes were formed as connecting electrodes by using solder balls.

Thereafter, the bump electrodes of the semiconductor chips and the packaging substrate were connected through an adhesive film having an elastic modulus of 1,500 MPa at 40° C. after bonding. First, the adhesive film was transferred and thereafter the bump electrodes of the semiconductor chips were registered to the semiconductor chip mounting circuit (connecting electrode terminals) of the packaging substrate, where the semiconductor chips were thermocompression-bonded for 20 seconds at a temperature of 180° C. and under a pressure of 10 kgf/cm$^2$ and the adhesive film was hardened. Thus, the bump electrodes of the semiconductor chips and the semiconductor chip mounting circuit of the packaging substrate were electrically interconnected through the adhesive film and at the same time this state of connection was kept between the semiconductor chips and the packaging substrate by the adhesive film hardened.

The member obtained in this way, whose semiconductor chips and packaging substrate were connected, was exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 100 mω or below.

EXAMPLE 2

Surface copper foil of a double-sided copper-clad glass-cloth epoxy resin laminated sheet MCL-E-679 (trade name; available from Hitachi Chemical Co., Ltd.), having a coefficient of linear expansion of 16 ppm/° C. in the X- and Y-directions, a Tg of about 170° C. and an elastic modulus of $1.8 \times 10^4$ MPa at Tg or below, was subjected to inner-layer circuit formation by a conventional subtractive process and inner-layer bonding. Next, a glass-cloth-free epoxy resin adhesive film with copper foil, MCF-3000E (trade name; available from Hitachi Chemical Co., Ltd.) previously drilled was bonded on the inner-layer circuit surface by press lamination at 170° C. under 40 kgf/cm$^2$ for 60 minutes, and then through holes were made, followed by electroless copper plating, outer-layer circuit formation by the subtractive process, and electroless nickel/gold plating to obtain a packaging substrate.

As semiconductor chips, used were those in which bump electrodes were formed as connecting electrodes by using ball bumps which are bump electrodes formed by bonding gold wires to electrodes followed by cutting. Thereafter, on the connecting electrodes formed on the packaging substrate correspondingly to the bump electrodes of the semiconductor chips, a conductive adhesive was coated and semi-hardened. The semiconductor chip's bump electrodes and the packaging substrate were further connected through an adhesive film having an elastic modulus of 1,500 MPa at 40° C. after bonding. First, the adhesive film was stuck onto the packaging substrate under registration and thereafter the bump electrodes of the semiconductor chips were registered to the semiconductor chip mounting circuit of the packaging substrate, where the semiconductor chips were thermocompression-bonded for 20 seconds at a temperature of 180° C. and under a pressure of 10 kgf/cm$^2$ and the adhesive was hardened. Thus, the bump electrodes of the semiconductor chips and the semiconductor chip mounting circuit coated with the conductive adhesive on the packaging substrate were electrically interconnected and at the same time this state of connection was kept between the semiconductor chips and the packaging substrate by the adhesive film hardened.

The member obtained in this way, whose semiconductor chips and packaging substrate were connected, was exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 100 mω or below.

EXAMPLE 3

Surface copper foil of a double-sided copper-clad glass-cloth epoxy resin laminated sheet MCL-E-679 (trade name; available from Hitachi Chemical Co., Ltd.), having a coefficient of linear expansion of 16 ppm/° C. in the X- and Y-directions, a Tg of about 170° C. and an elastic modulus of $1.8 \times 10^4$ MPa at Tg or below, was subjected to inner-layer circuit formation by a conventional subtractive process and inner-layer bonding. Next, a glass-cloth-free epoxy resin adhesive film with copper foil, MCF-3000E (trade name; available from Hitachi Chemical Co., Ltd.) previously drilled was bonded on the inner-layer circuit surface by press lamination at 170° C. under 40 kgf/cm² for 60 minutes, and then through holes were made, followed by electroless copper plating, outer-layer circuit formation by the subtractive process, and electroless nickel/gold plating to obtain a packaging substrate.

As semiconductor chips, used were those in which bump electrodes were formed as connecting electrodes by gold plating. Thereafter, the bump electrodes of the semiconductor chips and the packaging substrate were connected through an anisotropic conductive film having an elastic modulus of 1,500 MPa at 40° C. after bonding. First, the anisotropic conductive film was transferred to the packaging substrate and thereafter the bump electrodes of the semiconductor chips were registered to the semiconductor chip mounting circuit of the packaging substrate, where the semiconductor chips were thermocompression-bonded for 20 seconds at a temperature of 180° C. and under a pressure of 10 kgf/cm² and the anisotropic conductive film was hardened. Thus, the bump electrodes of the semiconductor chips and the semiconductor chip mounting circuit of the packaging substrate were electrically interconnected through the anisotropic conductive film and at the same time this state of connection was kept between the semiconductor chips and the packaging substrate by the adhesive of the anisotropic conductive film hardened.

The member obtained in this way, whose semiconductor chips and packaging substrate were connected, was exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 100 mω or below.

EXAMPLE 4

Packaging substrates were processed in the same manner as in Examples 1 to 3 except that the double-sided copper-clad glass-cloth epoxy resin laminated sheets were each replaced with a double-sided copper-clad glass-cloth epoxy resin laminated sheet MCL-E-679LD (trade name; available from Hitachi Chemical Co., Ltd.), having a coefficient of linear expansion of 9 to 11 ppm/° C. in the X- and Y-directions and an elastic modulus of 2.2×10⁴ MPa at Tg or below. Then the semiconductor chips and the packaging substrate were connected using the same semiconductor chips, adhesive film or anisotropic conductive adhesive film and packaging conditions as those in Examples 1, 2 and 3, respectively.

Members obtained in these way, whose semiconductor chips and packaging substrate were connected, were exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 50 mω or below.

EXAMPLE 5

Semiconductor chips and packaging substrate were connected in the same manner as in Example 4 except that the adhesive film or anisotropic conductive adhesive film was replaced with an anisotropic conductive film having an elastic modulus of 1,200 MPa at 40° C. after bonding.

Members obtained in these way, whose semiconductor chips and packaging substrate were connected, were exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 50 mω or below.

EXAMPLE 6

Semiconductor chips and packaging substrate were connected in the same manner as in Example 4 except that, after the inner-layer circuit formation was completed, a glass-cloth-free epoxy resin adhesive film AS-3000E (trade name; available from Hitachi Chemical Co., Ltd.; Tg: about 130° C.; elastic modulus at Tg or below: 0.23–0.3×10⁴ MPa) and a glass-cloth-free epoxy resin adhesive film with copper foil, MCF-3000E (trade name; available from Hitachi Chemical Co., Ltd.) were superposed in this order and bonded by lamination, and then through holes were made, followed by outer-layer circuit formation.

Members obtained in these way, whose semiconductor chips and packaging substrate were connected, were exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 50 mω or below.

Comparative Example

Semiconductor chips and packaging substrate were connected in the same manner as in Example 1 except that as the packaging substrates used in Examples 1 to 3 a double-sided copper-clad glass-cloth epoxy resin laminated sheet MCL-E-679 (trade name; available from Hitachi Chemical Co., Ltd.) was used, having a coefficient of linear expansion of 16 ppm/° C. in the X- and Y-directions and on which the circuit was formed.

Members obtained in these way, whose semiconductor chips and packaging substrate were connected, were exposed to a thermal shock cycle test repeated under conditions of (−55° C., 30 minutes)/(125° C., 30 minutes). After this thermal shock cycle test was made 1,000 times, the connection resistance between the bump electrodes of the semiconductor chips and the semiconductor chip mounting circuit of the packaging substrate was measured to find that it was 1 ω or above.

What is claimed is:

1. An electronic component part device having a packaging substrate and has at least one electronic component part mounted on the packaging substrate;

said electronic component part having a connecting electrode on the side coming into contact with the packaging substrate;

said packaging substrate having, on its surface, a connecting electrode terminal corresponding to the connecting electrodes of the electronic component part to be mounted; and said electronic component part being so provided that it is mounted on the connecting electrode terminal at the mounting position on the surface of the packaging substrate, with its own connecting electrode correspondingly to the connecting electrode terminal, the face of the electronic component part on which the connecting electrode have been formed and the surface of the packaging substrate are fastened by bonding through an adhesive, and the connecting electrode terminal of the substrate and the connecting electrode of the electronic component part are electrically interconnected; wherein;

said packaging substrate comprises;

a plurality of insulating layers;

a plurality of wiring layers provided between the insulating layers; and a conductor provided in such a way that it passes through at least one constituting layer of the insulating layers, in order to electrically interconnect predetermined layers among the wiring layers;

said plurality of insulating layers having;

at least one first insulating layer containing of a resin; and as an outermost layer, a second insulating layer which constitutes one layer at least on the side where the electronic component part is fastened by bonding;

said first insulating layer having a storage elastic modulus represented by E1, as measured by the DVE method, and the second insulating layer having a storage elastic modulus represented by E2, as measured by the DVE method, which are;

E2=0.01E1 to 0.5E1.

2. The electronic component part device according to claim 1, wherein said first insulating layer is constituted of a resin reinforced with a glass base material.

3. The electronic component part device according to claim 1, wherein said second insulating layer has storage elastic moduli of;

from $10^2$ to $10^4$ MPa at 25° C. and from $10^1$ to $10^3$ MPa at 100° C. as measured by the DVE method.

4. The electronic component part device according to claim 1, wherein at least one of said first insulating layers is an insulating layer having a coefficient of linear expansion of 13 ppm/° C. or below in its plane direction.

5. The electronic component part device according to claim 1, wherein said adhesive has a storage elastic modulus at 40° C. after bonding, of from 100 to 4,000 MPa.

6. The electronic component part device according to claim 1, wherein said adhesive contains at least an epoxy resin, an acrylic rubber and a latent curing agent.

7. The electronic component part device according to claim 1, wherein from 0.1 to 30% by volume of conductive particles are dispersed in said adhesive.

8. The electronic component part device according to claim 1, wherein said electronic component part is a semiconductor chip.

* * * * *